(12) United States Patent
Amita et al.

(10) Patent No.: US 6,881,278 B2
(45) Date of Patent: Apr. 19, 2005

(54) FLUX FOR SOLDER PASTE

(75) Inventors: Hitoshi Amita, Chiba (JP); Takashi Shoji, Chiba (JP); Shunsuke Nagasaki, Chiba (JP); Yoshinori Shibuya, Chiba (JP); Isamu Taguchi, Chiba (JP); Noriko Murase, Chiba (JP)

(73) Assignee: Showa Denko K.K., Tokyo (JP)

( * ) Notice: Subject to any disclaimer, the term of this patent is extended or adjusted under 35 U.S.C. 154(b) by 0 days.

(21) Appl. No.: 10/407,422

(22) Filed: Apr. 7, 2003

(65) Prior Publication Data

US 2003/0200836 A1 Oct. 30, 2003

Related U.S. Application Data (60) Division of application No. 09/951,486, filed on Sep. 14, 2001, and a continuation-in-part of application No. 09/537,717, filed on Mar. 30, 2000, now abandoned, and a continuation-in-part of application No. 09/646,308, filed as application No. PCT/JP99/03095 on Jun. 10, 1999, now abandoned.

(60) Provisional application No. 60/232,432, filed on Sep. 14, 2000, provisional application No. 60/135,841, filed on May 24, 1999, provisional application No. 60/135,842, filed on May 24, 1999, provisional application No. 06/159,529, filed on Oct. 18, 1999, provisional application No. 60/135,839, filed on May 24, 1999, provisional application No. 60/135,841, filed on May 24, 1999, and provisional application No. 60/135,842, filed on May 24, 1999.

(30) Foreign Application Priority Data

| Jun. 10, 1998 | (JP) | .......................................... | 10-161854 |
| Nov. 27, 1998 | (JP) | .......................................... | 10-336898 |
| Feb. 12, 1999 | (JP) | .......................................... | 11-343361 |
| Mar. 2, 1999 | (JP) | .......................................... | 11-026472 |
| Mar. 3, 1999 | (JP) | .......................................... | 11-088935 |
| May 10, 1999 | (JP) | .......................................... | 11-283870 |

(51) Int. Cl.$^7$ .......................................... B23K 35/363
(52) U.S. Cl. .......................................... 148/23; 148/24
(58) Field of Search .......................................... 148/23, 24, 22

(56) References Cited

U.S. PATENT DOCUMENTS

| 3,986,899 | A | | 10/1976 | Kole et al. |
| 5,229,070 | A | | 7/1993 | Melton et al. |
| 5,234,508 | A | * | 8/1993 | Kobayashi et al. ............ 148/24 |
| 5,904,782 | A | | 5/1999 | Diep-Quang |
| 5,918,796 | A | | 7/1999 | Matsuda et al. |
| 5,928,404 | A | | 7/1999 | Paruchuri et al. |
| 6,123,248 | A | | 9/2000 | Tadauchi et al. |
| 6,184,475 | B1 | * | 2/2001 | Kitajima et al. ............ 174/260 |
| 6,186,390 | B1 | | 2/2001 | Tadauchi et al. |
| 2003/0015574 | A1 | * | 1/2003 | Teshima et al. ............ 228/246 |

FOREIGN PATENT DOCUMENTS

| DE | 42 17 445 A | 12/1992 |
| EP | 0 264 939 A1 | 4/1998 |

(Continued)

OTHER PUBLICATIONS

ASM Handbook, vol. 7, Powder Metallurgy, pp. 837–841, 1984.*

The 10$^{th}$ Micro Joining, Solid Phase Welding and Brazing Soldering document "*Microsoldering Materials and Process*", Feb. 7, 1991, Japan Welding Society, Micro Joining, Solid Phase Welding and Brazing.

(Continued)

*Primary Examiner*—Daniel Jenkins
(74) *Attorney, Agent, or Firm*—Sughrue Mion, PLLC (57) ABSTRACT

A solder powder comprises solder particles having a distribution such that the number of particles having a particle diameter of 20 μm or less is 30% or less, wherein the oxygen content is 500 ppm or less. A flux for solder paste comprises an organic acid component consisting of an organic acid ester and an ester decomposer catalyst, an organic halogen compound, a reducing agent and a resin component. A solder paste mainly comprises a flux and a solder powder, wherein the water content of the solder paste is 0.5% by weight or less.

32 Claims, 1 Drawing Sheet

FOREIGN PATENT DOCUMENTS

| | | |
|---|---|---|
| EP | 875531 A2 | 11/1998 |
| GB | 1050441 A | 12/1996 |
| JP | 57-118891 A | 7/1982 |
| JP | 59-22632 B2 | 5/1984 |
| JP | 60-12295 A | 1/1985 |
| JP | 1-113197 A | 5/1989 |
| JP | 2-147194 A | 6/1990 |
| JP | 3-094994 A | 4/1991 |
| JP | 3-124092 A | 5/1991 |
| JP | 3-184698 A | 8/1991 |
| JP | 3-75277 B2 | 11/1991 |
| JP | 03-281094 A | 12/1991 |
| JP | 4-6392 U | 1/1992 |
| JP | 4-206683 A | 7/1992 |
| JP | 4-245495 A | 9/1992 |
| JP | 4-250691 A | 9/1992 |
| JP | 4-251691 A | 9/1992 |
| JP | 05-033017 A | 2/1993 |
| JP | 5-26598 B2 | 4/1993 |
| JP | 5-169289 A | 7/1993 |
| JP | 6-037440 A | 2/1994 |
| JP | 06-142975 A | 5/1994 |
| JP | 6-182679 A | 7/1994 |
| JP | 7-7244 A | 1/1995 |
| JP | 7-015889 A | 2/1995 |
| JP | 7-290278 A | 11/1995 |
| JP | 08-192291 A | 7/1996 |
| JP | 9-29485 A | 2/1997 |
| JP | 2608995 B2 | 2/1997 |
| JP | 8-243782 A | 9/1997 |
| JP | 9-239585 A | 9/1997 |
| JP | 9-327789 A | 12/1997 |
| JP | 10-004250 A | 1/1998 |
| JP | 10-006074 A | 1/1998 |
| JP | 10-052790 A | 2/1998 |
| JP | 63-90390 A | 4/1998 |
| JP | 10-175093 A | 6/1998 |
| JP | 63-220992 A | 9/1998 |
| JP | 11-092497 A | 4/1999 |
| JP | 11-197879 A | 7/1999 |
| JP | 11-267885 A | 10/1999 |

OTHER PUBLICATIONS

"Handbook of Powder Technology", edited by The Society of Powder Technology, Japan, Published by Nikkan Kogyo Shimbun, Ltd.

"The ECOnomics of Environmental Compliance", by SMT (Special Series) (Surface Mount Technology Magazine) (NEPCON West '97 Buyers' Guide), published on Feb. 1997, pp. 66 and 68.

Jennie S. Hwang, "Solder Paste in Electronics Packaging; Technology and Applications in Surface Mount, Hybrid Circuits, and Component Assembly", published in 1989 by Van Nostrand Reinhold, SCM Metal Products, Inc., p. 111.

Patent Abstracts of Japan, abstracting JP–A–09–327789 of Dec. 22, 1997.

Patent Abstracts of Japan, abstracting JP–A–2–147194 of Jun. 6, 1990.

Patent Abstracts of Japan, abstracting JP–A–60–261689 of Dec. 24, 1985 corresponding to JP–B2–5–26598.

Patent Abstracts of Japan, abstracting JP–A–1113197 of May 1, 1989.

Patent Abstracts of Japan, abstracting JP–A–3–184698 of Aug. 12, 1991.

Patent Abstracts of Japan, abstracting JP–A–4–251691 of Sep. 8, 1992.

International Search Report.

Patent Abstracts of Japan, abstracting JP–A–06–170581 of Jun. 21, 1994, corresponding to JP–B2–2608995 of Feb. 13, 1997.

Patent Abstracts of Japan, abstracting JP–A–10–175093 of Jun. 30, 1998.

Patent Abstracts of Japan, abstracting JP–A–57–118891 of Jul. 23, 1982.

Patent Abstracts of Japan, abstracting JP–A–3–75277 of Nov. 29, 1991.

Patent Abstracts of Japan, abstracting JP–A–11–197879 of Jul. 27, 1999.

Patent Abstracts of Japan, abstracting JP–A–63–90390 of Apr. 21, 1988.

Patent Abstracts of Japan, abstracting JP–A–56–163094 of Dec. 15, 1981 corresponding to JP–B2–59–22632.

Patent Abstracts of Japan, abstracting JP–A–3–124092 of May 27, 1991.

Patent Abstracts of Japan, abstracting JP–A–07–007244 of Jan. 10, 1995.

Patent Abstracts of Japan, abstracting JP–A–11–267885 of Oct. 5, 1999.

Patent Abstracts of Japan, abstracting JP–A–63–220992 of Sep. 14, 1988 corresponding to JP–B2–3–75277.

Patent Abstracts of Japan, abstracting JP–A–60–12295 of Jan. 22, 1985.

Patent Abstracts of Japan, abstracting JP–A–9–29485 of Feb. 4, 1997.

Patent Abstracts of Japan, abstracting JP–A–9–239585 of Jan. 16, 1997.

Patent Abstracts of Japan, abstracting JP–A–8–243782 of Sep. 24, 1996.

Patent Abstracts of Japan, abstracting JP–A–7–290278 of Nov. 7, 1995.

Shaden Hojin Yousetsu Gakkai Symposium, Micro–electronics ni okeru shou bisai setsugou, pp. 59–63 (1993) (Interface and InnovativeIntegration).

Patent Abstracts of Japan, abstracting JP 06182679A of Jul. 5, 1994.

Derwent Abstracts, abstracting JP –01192497A of Jan. 29, 1988.

L. Petrnin, "Handbuch der Lottechinik", Verlag Technik GmbH Berlin P. 82, $1^{st}$ edition, 1991.

Dr. Ing. Erich Luder, "Handbuch der Lottchnik", Verlag Technik GmbH Berlin, P. 155 (1952).

Patent Abstracts of Japan, abstracting JP 04250691A of Sep. 7, 1992.

Patent Abstracts of Japan, abstracting JP 06037440A of Feb. 2, 1994.

Patent Abstracts of Japan, abstracting JP 04206683A of Jul. 28, 1992.

Patent Abstracts of Japan, abstracting JP 10004250A of Jan. 6, 1998.

Patent Abstracts of Japan, abstracting JP 04245495A of Sep. 2, 1992.

Patent Abstracts of Japan, abstracting JP–A–5–169289 of Jul. 9, 1993.

Patent Abstracts of Japan, abstracting JP–A–3–094994 of Apr. 19, 1991.

Patent Abstracts of Japan, abstracting JP–A–7–051889 of Feb. 28, 1995.

Patent Abstracts of Japan, abstracting JP–A–10–006074 of Jan. 13, 1998.

* cited by examiner

FLUX FOR SOLDER PASTE

CROSS-REFERENCE TO RELATED APPLICATIONS

This Application is a divisional of U.S. application Ser. No. 09/951,486, filed Sep. 14, 2001, currently pending, which claims the benefit of Provisional Application No. 60/232,432, filed Sep. 14, 2000, which U.S. application Ser. No. 09/951,486 is a Continuation-In-Part of U.S. application Ser. No. 09/537,717, filed on Mar. 30, 2000, now abandoned, which claims the benefit of U.S. Provisional Application Nos. 60/135,841, 60/135,842 and 60/159,529, filed on May 24, 1999, May 24, 1999 and Oct. 18, 1999, respectively, all of which Provisional Applications are now abandoned, and which U.S. application Ser. No. 09/951,486 is a Continuation-In-Part of application Ser. No. 09/646,308, filed Sep. 15, 2000, now abandoned, which was the National Stage of International Application No. PCT/JP99/03095, filed Jun. 10, 1999, which was published under PCT Article 21(2) in Japanese, and which claims the benefit of U.S. Provisional Application Nos. 60/135,839, 60/135,841 and 60/135,842, filed May 24, 1999, May 24, 1999 and May 24, 1999, respectively, all of which Provisional Applications are now abandoned, and all of which applications are hereby incorporated by reference.

BACKGROUND OF THE INVENTION

1. Field of the Invention

The present invention relates to a solder powder, a flux, and a solder paste, which have excellent storage stability and ensure excellent properties in and after reflow; and further relates to a soldering method using the solder paste; a soldered circuit board, and a soldered joint product for electronic parts.

This application is based on Japanese Patent Applications No. Hei 10-161854, No. Hei 10-336898, No. Hei 11-26472, No. Hei 11-88935, No. Hei 11-283870, No. Hei 11-343361, No. 2000-86803, and No. 2000-217317, and provisional patent applications Ser. Nos. 60/135,839, 60/135,841, 60/135,842, 60/159,529, and 60/232,432 filed in U.S., the contents of which are incorporated herein by reference.

2. Description of the Related Art Including Information Disclosed Under 37 CFR 1.97 and 37 CFR 1.98

Solder paste is used for surface mounting of electronic parts in the electronics industry. Solder paste is suitable for automation because of its printing adaptability and tackiness, therefore, the amount thereof used has been increasing in recent years.

In the electronics industry, a solder paste is coated on a printed board by screen printing or, depending on the case, by a dispenser, then electronic parts are mounted thereon and subsequently, the board is subjected to reflow to fix the electronic parts. "Reflow" means a series of operations such that a board on which electronic parts are mounted is preheated and then the solder paste is heated at a temperature higher than its melting point to weld the parts.

On the other hand, miniaturization of electronic articles has been proceeding in recent years and many kinds of fine pitch parts are used, such as 0.3 mm-pitch QFP (quad flat package) type LSI or even CSP (chip size package). To keep up with this tendency, the solder paste must to have capability for extremely fine pitch printing. This requirement is met by reducing the average particle size of the solder metal particles. However, this technique has a problem in that the specific surface area of particles as a whole is increased and reaction between solder metal particles and flux is accelerated, as a result, the storage stability of the solder paste is degraded.

One of the greatest causes of reduction in the storage stability of the solder paste is in the fact that the solder powder preferentially reacts with flux during storage to allow oxidation to proceed and the activator to be consumed, whereby the activity of the flux decreases and due to the reaction product, the viscosity of the solder paste increases. Because of this, the solder paste cannot maintain its suitable printing property and does not melt at the time of reflow.

In order to improve the stability of solder paste, efforts have been heretofore made with an attempt to protect the surface of the solder metal particles and thereby reduce the reactivity of the metal.

For example, a method of covering solder powder with glycerin (see Japanese Examined Patent Application, Second Publication, No. Hei 5-26598) and a method of coating solder powder with a coating agent insoluble or sparingly soluble in the solvent of the solder paste (see Japanese Unexamined Patent Application, First Publication, No. Hei 1-113197) are known. In the latter case, suitable examples of the coating agent include silicone oil, silicone-based high molecular weight compounds, fluorinated silicone oil, fluorosilicone resin and fluorinated hydrocarbon-based polymer compounds.

In addition, a method of coating solder powder with a rosin-based mixture, namely, a resin mainly comprising rosin, incompatible with flux at room temperature but compatible with flux at the soldering temperature is known (see Japanese Unexamined Patent Application, First Publication, No. Hei 3-184698 and Japanese Unexamined Patent Application, First Publication, No. Hei 4-251691).

According to the method disclosed in Japanese Examined Patent Application, Second Publication, No. Hei 5-26598 and Japanese Unexamined Patent Application, First Publication, No. Hei 1-113197, although covering with a relatively large amount of coating agent may be effective in suppressing the oxidation of solder powder, the large amount of coating material is rather disadvantageous for the reflow of solder paste and many solder balls may be generated. Furthermore, there is a strong fear that the coating agent will come off during kneading at the production of solder paste or by treatment such as transportation, printing or the like on use, because only a physical covering is made and the adhesion seems to be very weak.

The coating agent, that is, the resin mainly comprising rosin, disclosed in Japanese Unexamined Patent Application, First Publication, No. Hei 3-184698 and Japanese Unexamined Patent Application, First Publication, No. Hei 4-251691 contains by itself many reactive organic acids and cannot successfully protect the metal powder.

Other than these methods, a method of using acidic phosphoric acid ester as an activator for solder paste and an incombustible or flame retardant low volatile diluent having compatibility with the acidic phosphoric acid ester (Japanese Unexamined Patent Application, First Publication, No. Sho 63-90390), adding a phenol-, phosphorus- or sulfur-based antioxidant (Japanese Examined Patent Application, Second Publication, No. Sho 59-22632 and Japanese Unexamined Patent Application, First Publication, No. Hei 3-124092), or using a specific surface active agent (Japanese Unexamined Patent Application, First Publication, No. Hei 2-147194) is proposed. However, when using these methods, the storage stability of the solder paste is not satisfactory.

In recent years, due to environmental problems, a solder paste containing no lead, so-called Pb-free solder paste, is recommended and to cope with this, development is being driven so as to make the solder paste a Pb-free solder paste.

As the most effective Pb-free solder paste, Sn—Zn system solder pastes are drawing attention, however, they are fairly bad in storage stability as compared with usual Pb-based solder paste, for example, oxidation of Zn in the solder powder proceeds or reaction between Zn and flux takes place at room temperature and the viscosity of the paste increases with the passage of time. In particular, it has been found that Zn reacts with halogen generated by the decomposition of an organic halogen compound in the flux at room temperature, so that the storage stability of the solder paste decreases. Furthermore, a halogen compound in the flux and Zn in the solder powder react to generate a small amount of hydrogen gas, and the small amount of hydrogen generated is imprisoned as a gas in the solder fillet, causing a serious problem in reliability.

Furthermore, one of the causes of the deterioration in soldering property, namely that solder metal is oxidized during the preheating of solder paste, during the reflow process or during the melting of the solder metal, as a result, non-melted solder metal may remain on a board or solder balls may be generated.

BRIEF SUMMARY OF THE INVENTION

The object of the present invention is to provide a flux, a solder paste, and a solder powder which can be used therein so as to prevent the generation of solder balls, each having excellent storage stability, reflow property, solderability, wettability to a metal to be welded, and printing property, and further to provide a soldering method, a soldered circuit board, and a joint product for a circuit board and electronic parts, respondent to the tendency toward fine pitch processing, diversified parts and the like, and thereby overcoming the above-described problems.

As a result of extensive studies to attain the above-described object, the present inventors have accomplished the present invention.

The present invention provides a solder powder comprising solder particles having a distribution such that the number of particle having a particle diameter of 20 μm or less is 30% or less.

The solder powder may comprise the oxygen content of 500 ppm or less.

The solder powder may comprise Sn and Zn, or Sn and Ag.

The present invention further provides a flux for solder paste comprising an organic acid component consisting of an organic acid ester and an ester decomposer catalyst, an organic halogen compound, a reducing agent and a resin component.

The ester decomposer catalyst may be an organic base hydrohalogenated acid salt.

The organic halogen compound may comprise at least one of a bromide of a benzyl compound containing a substituent having an alkyl chain with a carbon number of 10 or higher, and a polybromine compound containing a fatty acid or an alicyclic compound with a carbon number of 10 or higher wherein the polybromine comprises four or more bromine atoms in one molecule.

The reducing agent may be at least one selected from the group consisting of phenol compounds, phosphorus compounds, sulfur compounds, lecithin, tocopherol, tocopherol derivatives, ascorbic acid and ascorbic acid derivatives.

The reducing agent may be a combination of at least one of tocopherol and a tocopherol derivative with at least one of ascorbic acid and an ascorbic acid derivative.

The tocopherol derivative may be selected from the group consisting of acetic acid tocopherol ester and nicotinic acid tocopherol ester.

The tocopherol derivative may be selected from the group consisting of phosphoric acid tocopherol ester and sorbic acid tocopherol ester.

The tocopherol derivative is selected from the group consisting of tocol and tocopherol derivatives containing at least one of the following structures.

-continued

In the above structures, R=$C_nH_{2n+1}$, (n=1 to 16).

The ascorbic acid derivative may be selected from the group consisting of ascorbyl-2,6-dibutylate, ascorbyl-2,6-distearate, and ascorbyl-2,6-dimyristilate.

The ascorbic acid derivatives may be selected from the group consisting of ascorbyl-2-glucoside-6-palmitate, ascorbyl-2-glucoside-6-myristilate, and ascorbyl-2-glucoside-6-stearate.

The ascorbic acid derivatives may be selected from the group consisting of ascorbic acid 2-phosphite, ascorbic acid 2-sulfate, ascorbyl-2-glucoside, ascorbyl-6-palmitate, ascorbyl-6-stearate, and ascorbyl-6-myristilate.

The ascorbic acid derivatives may be selected from the group consisting of ascorbyl-2,3,5,6-tetrapalmitate, ascorbyl-2,3,5,6-tetramyristilate, ascorbyl-2,3,5,6-tetrastearate, ascorbyl-5,6-o-benzylidene, ascorbyl-5,6-o-isopropylidene, ascorbyl-2-phosphite-5,6-o-benzylidene, and ascorbyl-2-phosphite-5,6-o-isopropylidene.

The resin component may comprise a rosin having an acid value of from 150 to 250 and a softening point of from 120 to 200° C.

The flux for solder paste may comprise the above rosin in a ratio of 30% by weight or more based on the total amount of the resin component.

The flux for solder paste may comprise, based on the total amount of the flux, 20 to 60% by weight of a resin component, 0.01 to 20% by weight of an organic acid component, 0.02 to 20% by weight of an organic halogen compound, and 0.05 to 20% by weight of a reducing agent.

The flux for solder paste may comprise a pH adjusting agent, wherein a solution prepared by dissolving 4 g of the flux comprising a pH adjusting agent in a mixture of 50 ml of toluene, 49.5 ml of isopropyl alcohol, and 0.5 ml of water, has a pH value of 4 to 9 when measured with a pH meter.

The above flux for solder paste may comprise, based on the total amount of the flux, 20 to 60% by weight of a resin component, 0.01 to 20% by weight of an organic acid component, 0.02 to 20% by weight of an organic halogen compound, 0.05 to 20% by weight of a reducing agent, and 0.05 to 20% by weight of a pH adjusting agent.

The pH adjusting agent may comprise at least one amine selected from the group consisting of alkanolamines, aliphatic primary, secondary or tertiary amines, aliphatic unsaturated amines, alicyclic amines, and aromatic amines.

The present invention provides a solder paste mainly comprising a flux and a solder powder.

The solder paste may have a water content of 0.5% by weight or less.

The solder paste may have a pH value of 4 to 9 measured by a pH meter after a solution which is prepared by dissolving 4 g of a flux comprising a pH adjusting agent in a mixture of 50 ml of toluene, 49.5 ml of isopropyl alcohol, and 0.5 ml of water is added.

The pH adjusting agent may comprise at least one amine selected from the group consisting of alkanolamines, aliphatic primary, secondary or tertiary amines, aliphatic unsaturated amines, alicyclic amines and aromatic amines.

The solder powder may comprise solder particles having a distribution such that the number of particle having a particle diameter of 20 μm or less is 30% or less.

The solder paste may comprise, based on the total amount of the solder paste, 86 to 92% by weight of the solder powder and 8 to 14% by weight of the flux for solder paste which comprises an organic acid component consisting of an organic acid ester and an ester decomposer catalyst, an organic halogen compound, a reducing agent and a resin component.

The present invention further provides a soldering method for a circuit board comprising the steps of applying the solder paste to a circuit board and causing the solder paste applied on the circuit board to reflow.

The soldering method for a circuit board may comprise the step of placing electronic parts on the circuit board, wherein a part or all of the solder paste which has been caused to reflow is used to join the circuit board and the electronic parts together.

By the soldering method for a circuit board, a circuit board or a joint product may be produced.

By using the solder powder and the flux in the present invention, the reaction of the solder powder and the flux is greatly suppressed and very excellent storage stability can be successfully developed. In particular, the solder paste of the present invention can greatly improve the storage stability even in the Pb-free solder paste which has been heretofore considered to be poor in storage stability, and its effectiveness is revealed.

Furthermore, by developments of the solder paste of the present invention, a fine pitch mount wiring board, a soldering method for a circuit board corresponding to various parts, a soldered circuit board, a soldering method to join a circuit board and electronic parts together, and the joint product can be provided.

Furthermore, the present invention provides a method for joining metals comprising the steps of: applying a solder paste which contains Sn and Zn to each joining portion of one or more metals selected from the group of aluminum, aluminum alloy, copper, and copper alloy; and reflowing the applied solder paste. In the method for joining metals, one of the metals to be joined may be aluminum or aluminum alloy, and another metal may be copper or copper alloy.

The joining method of the present invention enables joining of aluminum, an aluminum alloy, copper, and a copper alloy, which has been difficult to perform by a conventional method. Even when one of metals to be joined is aluminum or an aluminum alloy, while the other metal is copper or a copper alloy, the metals are favorably joined, thereby enabling provision of a joined product of low thermal resistance at the joined portion, which cannot be provided by a conventional method.

Furthermore, a metal-to-metal joined product may be joined by the method described in the above method for joining metals.

The metal-to-metal joined product may contain at least one component selected from the group of a heat sink, a power module substrate, a microprocessor unit (MPU), and a central processing unit (CPU).

The metal-to-metal joined product is manufactured in a simple process by the manufacturing method of the present invention. This method enables joining at low temperature and prevents thermal strain in the joined portion and thermal deterioration of joined components. Particularly, inclusion of Bi in a solder paste further lowers the joining temperature, thereby more effectively preventing thermal strain in the joined portion and thermal deterioration of joined components.

Furthermore, the above solder paste, soldering method, and the like may be used for forming solder bump electrodes on an IC chip.

DETAILED DESCRIPTION OF THE INVENTION

Examples of the metal composition for solder powder which can be used in the solder paste of the present invention include Sn—Pb systems, Sn—Pb—Ag systems, Sn—Pb—Bi systems, Sn—Pb—Bi—Ag systems and Sn—Pb—Cd systems. In addition, from the standpoint of eliminating Pb, for which demand has been increasing in recent years, Pb-free systems such as Sn—In systems, Sn—Bi systems, In—Ag systems, In—Bi systems, Sn—Zn systems, Sn—Ag systems, Sn—Cu systems, Sn—Sb systems, Sn—Au systems, Sn—Bi—Ag—Cu systems, Sn—Ge systems, Sn—Bi—Cu systems, Sn—Cu—Sb—Ag systems, Sn—Ag—Zn systems, Sn—Cu—Ag systems, Sn—Bi—Sb systems, Sn—Bi—Sb—Zn systems, Sn—Bi—Cu—Zn systems, Sn—Ag—Sb systems, Sn—Ag—Sb—Zn systems, Sn—Ag—Cu—Zn systems and Sn—Zn—Bi systems may be used.

Specific examples of the above systems include a eutectic solder comprising 63% by weight of Sn and 37% by weight of Pb (hereinafter written as 63Sn/37Pb), 62Sn/36Pb/2Ag, 62.6Sn/37Pb/0.4Ag, 60Sn/40Pb, 50Sn/50Pb, 30Sn/70Pb, 25Sn/75Pb, 10Sn/88Pb/2Ag, 46Sn/8Bi/46Pb, 57Sn/3Bi/40Pb, 42Sn/42Pb/14Bi/2Ag, 45Sn/40Pb/15Bi, 50Sn/32Pb/18Cd, 48Sn/52In, 43Sn/57Bi, 97In/3Ag, 58Sn/42In, 95In/5Bi, 60Sn/40Bi, 91Sn/9Zn, 96.5Sn/3.5Ag, 99.3Sn/0.7Cu, 95Sn/5Sb, 20Sn/80Au, 90Sn/10Ag, Sn90/Bi7.5/Ag2/Cu0.5, 97Sn/3Cu, 99Sn/1Ge, 92Sn/7.5Bi/0.5Cu, 97Sn/2Cu/0.8Sb/0.2Ag, 95.5Sn/3.5Ag/1Zn, 95.5Sn/4Cu/0.5Ag, 52Sn/45Bi/3Sb, 51Sn/45Bi/3Sb/1Zn, 85Sn/10Bi/5Sb, 84Sn/10Bi/5Sb/1Zn, 88.2Sn/10Bi/0.8Cu/1Zn, 89Sn/4Ag/7Sb, 88Sn/4Ag/7Sb/1Zn, 98Sn/1Ag/1Sb, 97Sn/1Ag/1Sb/1Zn, 91.2Sn/2Ag/0.8Cu/6Zn, 89Sn/8Zn/3Bi, 86Sn/8Zn/6Bi, and 89.1Sn/2Ag/0.9Cu/8Zn. Furthermore, as the solder powder of the present invention, a mixture of two or more kinds of solder powders having different metal compositions respectively may be used.

Among these, Pb-free solder, preferably an alloy composition selected from the group consisting of all solders containing Sn and Zn or Sn and Ag is used for preparing the solder paste of the present invention. Such solder paste can have a lower reflow temperature equal to the reflow temperature of an Sn—Pb system solder, so that mounting parts can have long life and be varied.

The solder powder has a particle size standard specified in JIS of from 63 to 22 $\mu$m, from 45 to 22 $\mu$m, from 38 to 22 $\mu$m, and the like, according to the sieving method. The particle size distribution of the solder powder is generally determined with a method of using a standard sieve and a balance specified by JIS. However, solder fine particles in the solder powder often adhere to the surface of the solder powder due to static electricity or the like and the fine particles cannot efficiently be separated from the surface of the solder powder by the above method, therefore, the amount of solder fine particles in the solder powder detected in the method is smaller than the actual amount of solder fine particles in the solder powder. For example, when the solder powder is observed through a microscope after sieving the solder powder according to the particle size distribution measurement specified in JIS, it is found that many fine particles of solder are adhering to the surface of larger solder particles. As the amount of these fine particles in the solder powder increases, the solder powder tends to oxidize and storage stability and reflow property of the solder paste are degraded.

Furthermore, for the particle size distribution measurement, using the distribution of fine particles by number in the solder powder with the measuring method specified in JIS, it was found that the solder powder has excellent properties.

The fine particle content of solder powder may be obtained by performing image analysis using a microscope and determining the particle size distribution in terms of the particle number ratio. Also, the distribution of fine particles by number may be determined by a Coulter counter using an electrozone method. The principle of the Coulter counter is described in "Funtai Kogaku Binran (Handbook of Powder Engineering)", Second Edition, pages 19–20 (which is edited by Funtai Kogaku Kai). More specifically, a solution having powder dispersed therein is passed through a slit bored in a partition wall and change in the electric resistance at both sides of the slit is measured to determine the particle size distribution of the powder, where the particle number ratio of the powder can be measured with good reproducibility.

When using the above method to determine the particle size distribution of the solder powder, dispersing the solder powder in a solution causes the fine particle component adhering to the solder particle to separate from the solder powder, therefore, the fine particle component, which cannot be identified in the measurement of weight distribution or volume distribution by conventional sieving methods, can be quantified.

In either method by observation through a microscope or by a Coulter counter, the lower limit of the fine particle size which can be measured is about 1 μm. In the case of fine particles of less than 1 μm, the amount of contamination by the fine particle cannot be determined by either method, however, fine particles prepared by ordinary atomizing methods scarcely contain particles of less than 1 μm in size. Therefore, for distribution of fine particles by number measurement of fine particles of solder powder by the above methods, the fine particles may be limited 1 μm or more size.

The distribution of fine particles by number is preferably controlled so that the content of the solder particles having a particle size of 20 μm or less in the solder powder is 30% by number or less, and preferably 20% by number or less. When the content of the solder particles having a particle size of 20 μm or less exceeds 30% by number or less, the surface area of the solder powder per unit weight increases and oxidation occurs easily, so that the melting property of the solder powder is adversely affected in reflow when preparing the solder paste. Furthermore, since the solder powder readily reacts with the flux, storage stability is shortened and the tackiness is reduced.

In order to reduce the amount of contamination by fine particles in the solder powder, the classification can be performed by setting the classification point for the solder powder at a level higher than the target particle size, repeating air classification and sieving of the solder powder until the amount of contamination by fine particles in the solder powder attains a predetermined level or less, reducing the powder feeding rate to easily remove the fine particles, or using wet classification with a solvent excluding water.

In the solder powder used in the present invention, a solder powder having a particle size equal to or less than a sieve opening for specifying the upper limit of the particle size by sieving accounts for 90% or more, preferably 95% or more in the weight distribution.

The oxygen content in the solder powder used in the present invention is preferably as low as possible and is adjusted to preferably 500 ppm or less, and more preferably 300 ppm or less, therefore, the storage stability and reflow property of the solder paste are improved. In order to reduce the oxygen content in the solder powder, it is effective that the atomizing step to prepare the solder powder is carried out under a condition so that oxidation of the solder powder is very low and the prepared solder powder is treated under the condition of very low oxidizing. Specifically, the above step is preferably carried out under nitrogen gas or inert gas.

The solder paste mainly comprises a flux and a solder powder, wherein the water content of the solder paste is 0.5% by weight or less. The flux is selected from the group of a resin component, an organic acid component, a reducing agent, an organic halogen compound, a solution, a thixotropic agent, and the like.

The organic acid component consisting of organic acid ester and ester decomposer catalyst in the flux component of the present invention effectively removes oxide of metal surface of the circuit board and oxide of the solder powder during the reflow process. However, even if a large amount of the flux is added so as to remove a large amount of oxide or the like, excessive flux reacts with the solder powder in storage and, at the same time, accelerates decomposition of the organic halogenated compound which is the other effective component in the flux, so that the solder paste deteriorates.

As a result of extensive investigations, the solder paste of the present invention was particularly developed for superior storage stability and reflow property by the addition of a reducing agent and an organic halogen compound to the flux comprising a combination of an organic acid ester and an ester decomposer catalyst wherein the organic acid ester as an organic acid component is stably held in ester form in storage. Furthermore, using the solder paste for soldering makes it possible to respond to diversification of fine pitch circuit boards and parts because of improvement of the reflow property, and make it possible to provide a soldering method for the solder paste, a soldered circuit board, and a soldered joint product for electronic parts, and thereby the present invention has been accomplished.

In the present invention, examples of the organic acid ester as a compound which generates an organic acid at a reflow temperature include various aliphatic carboxylic acid esters, aromatic carboxylic acid esters, aliphatic sulfonic acid esters and aromatic sulfonic acid esters.

Among these organic acid esters, as the alcohol residue of these esters, alkyl and aryl are preferred, and a tert-butyl group, an isopropyl group and an isobutyl group which facilitate the decomposition of ester are particularly preferred. The compound may contain a halogen.

Specific examples of the compound include n-propyl paratoluenesulfonate, isopropyl paratoluenesulfonate, isobutyl paratoluenesulfonate, n-butyl paratoluenesulfonate, n-propyl benzenesulfonate, isopropyl benzenesulfonate, isobutyl benzenesulfonate, n-propyl salicylate, isopropyl salicylate, isobutyl salicylate, n-butyl salicylate, isopropyl 4-nitrobenzoate, tert-butyl 4-nitrobenzoate, tert-butyl methacrylate, tert-butyl acrylate, tert-butyl malonate and tert-butyl bromoacetate.

Among these, n-propyl paratoluenesulfonate, isobutyl salicylate and tert-butyl bromoacetate are particularly preferred. The amount of the compound added is from 0.01 to 20% by weight, preferably from 0.05 to 5% by weight, based on the flux as a whole.

The above decomposable organic acid ester exhibits low decomposability by itself even at the reflow temperature, therefore, it is effective to add a slight amount of ester decomposer catalyst to accelerate the decomposition. As an ester decomposer catalyst, any decomposable organic acid ester is effective as long as it accelerates the decomposition at the reflow temperature for generation of organic acids, particularly a hydrohalogenated acid salt of an organic base is effective.

Specific examples of the hydrohalogenated acid salt of an organic base include hydrohalogenated acid amine salts such as isopropylamine hydrobromide, butylamine hydrochloride and cyclohexylamine hydrobromide and 1,3-diphenylguanidine hydrobromide.

With regard to the flux and solder paste of the present invention, the storage stability of the solder paste can be remarkably improved by using a reducing agent as a stabilizer in combination with the above-described organic acid component.

Examples of the reducing agent include a phenol-based compound capable of dissolving in a solvent, a phosphorous-based compound, a sulfur-based compound, lecithin, tocopherol or derivatives thereof, and ascorbic acid or derivative thereof, which are usually used as antioxidants for resins and the like.

Specific examples of the phenol compound include hydroquinone, catechol, 2,6-di-tert-butyl-p-cresol, butyl hydroxyanisol, 2,2'-methylene bis(4-methyl-6-tert-butylphenol), and the like.

Specific examples of a phosphorus compound include triphenyl phosphite, trioctadecyl phosphite, tridecyl phosphite, and the like.

Specific examples of a sulfur compound include dilauryl-3,3'-thiodipropionate, distearyl-3,3'-thiodipropionate, dimyristyl-3,3'-thiodipropionate, and the like.

The tocopherol or derivative thereof, or ascorbic acid or derivative thereof may be any compound insofar as it has a reducing property and solubility in the solvent. In particular, good results may be obtained when tocopherol or a derivative thereof and ascorbic acid or a derivative thereof are used in combination. The blending ratio therebetween is from 0.5:1 to 1:0.5 (by weight), and preferably nearly 1:1 (by weight).

Furthermore, when tocopherol or a derivative thereof and ascorbic acid or a derivative thereof are used in combination, the addition of lecithin causes the reducing power to improve further.

Specific examples of the ascorbic acid derivatives include an ascorbyl-2-phosphite, an ascorbyl-2-sulfate, an ascorbyl-2-glucoside, an ascorbyl-2,6-dibutylate, an ascorbyl-2,6-distearate, an ascorbyl-2,6-dimyristilate, an ascorbyl-6-palmitate, an ascorbyl-6-stearate, an ascorbyl-6-myristilate, an ascorbyl-2,3,5,6-tetrapalmitate, an ascorbyl-2,3,5,6-tetramyristilate, an ascorbyl-2,3,5,6-tetrastearate, an ascorbyl-2-glucoside-6-palmitate, an ascorbyl-2-glucoside-6-stearate, an ascorbyl-2-glucoside-6-myristilate, an ascorbyl-5,6-o-benzylidene, an ascorbyl-5,6-o-isopropylidene, an ascorbyl-2-phosphite-5,6-o-benzylidene, and an ascorbyl-2-phosphite-5,6-o-isopropylidene (hereinafter the above examples are called "Group A"). Furthermore, specific examples of the tocopherol derivatives include tocol, acetic acid tocopherol ester, phosphoric acid tocopherol ester, sorbic acid tocopherol ester, nicotinic acid tocopherol ester and tocopherol derivatives containing at least one of the following structures (hereinafter the above examples are called "Group B").

-continued

In the above structures, R=$C_nH_{2n+1}$, (n=1 to 16).

The compounds of the Group A and the compounds of the Group B are vitamin C derivatives and vitamin E derivatives respectively. Such compounds of specific vitamin C and E derivatives are preferred as antioxidant because of (1) superior solubility of the compound in the solvent when preparing the flux, (2) stability of the compound without thermal decomposition during the preheating step of the solder paste, and (3) excellent solderability of the compounds due to the increase in the reduction ability of the compound with thermal decomposition of the compounds during the reflow step which has severe oxidizing conditions, and the performance of the free carboxylic acid or the like as an activator.

In the Group A, considering the above effects of (1) to (3), the storage stability and the reduction ability of the flux, the most effective additives are ascorbyl-2,6-dibutylate, ascorbyl-2,6-distearate, and ascorbyl-2,6-dimyristilate; the next effective additives are ascorbyl-2-glucoside-6-palmitate, ascorbyl-2-glucoside-6-stearate, and ascorbyl-2-glucoside-6-myristilate; and further the next effective additives are ascorbyl-2-phosphite, ascorbyl-2-sulfate, ascorbyl-2-glucoside, ascorbyl-6-palmitate, ascorbyl-6-stearate, and ascorbyl-6-myristilate.

In the Group B, regarding the same causes, the most effective additives are acetic acid tocopherol ester and nicotinic acid tocopherol ester; and more effective additives are phosphoric acid tocopherol ester and sorbic acid tocopherol ester.

These reducing agents may be used either individually or in combination. The amount of reducing agent added may be sufficient if it is large enough to ensure the storage stability of the solder paste (particularly, to prevent the reaction of Zn with halogen in a Pb-free solder), however, the reducing agent is generally used in an amount of from 0.005 to 20% by weight, preferably from 0.01 to 10% by weight, based on the total amount of the flux. If the amount added is too small, the stabilizing effect is not obtained, whereas if the amount added is more than 20% by weight, improved effects corresponding to the increased concentration are not obtained, therefore, too small or too high an amount is not preferable.

The mechanism of action of the reducing agent cannot be fully elucidated, however, it is considered that the reducing agent suppresses oxidation of Zn in the solder paste and also acts as an acceptor of free halogen isolated from the halogen-containing component and the halogen isolated effectively prevents reaction with the solder powder, particularly with Zn in the solder powder. In the case of Pb-containing solder, it is considered that the same effect is also brought out by the reducing agent.

In the present invention, an organic halogen compound is used as the flux and the solder paste. Organic halogen compounds commonly used as solder flux may be used, and in order to more improve solderability and wettability of the solder paste, an organic halogen compound which is stably present as an organic halogen compound during the storage of solder paste but decomposes at a reflow temperature to become active is preferably used, specifically an organic bromine compound is more preferably used.

Examples of an organic bromine compound having such performance include a bromide of a benzyl compound having a substituent containing an alkyl chain having 10 or more carbon atoms, and a polybromine compound containing four or more bromines within one molecule of an aliphatic or alicyclic compound having 10 or more carbon atoms. These compounds may be used in combination.

The benzyl bromide compound containing an alkyl chain having 10 or more carbon atoms may be any compound insofar as it is a bromine compound where the bond between the alkyl chain and the benzyl halogenide is chemically stable.

Specific examples of the benzyl bromide compound include compounds such as 4-stearoyloxybenzyl bromide, 4-stearyloxybenzyl bromide, 4-stearylbenzyl bromide, 4-bromomethylbenzyl stearate, 4-stearoylaminobenzyl bromide and 2,4-bisbromomethylbenzyl stearate. Other examples include 4-palmitoyloxybenzyl bromide, 4-myristoyloxybenzyl bromide, 4-lauroyloxybenzyl bromide and 4-undecanoyloxybenzyl bromide.

The polybromine compound may have a chemically stable functional group such as a carboxyl group, an ester group, an alcohol group, an ether group and a ketone group. The polybromine is a compound where four or more bromine atoms are bonded.

Specific examples of these compounds include 9,10,12,13,15,16-hexabromostearic acid, methyl 9,10,12,13,15,16-hexabromostearate, ethyl 9,10,12,13,15,16-hexabromostearate, 9,10,12,13-tetrabromostearic acid, methyl 9,10,12,13-tetrabromostearate, ethyl 9,10,12,13-tetrabromostearate, 9,10,12,13,15,16-hexabromostearyl alcohol, 9,10,12,13-tetrabromostearyl alcohol and 1,2,5,6,9,10-hexabromocyclododecane. Among these compounds, hexabromostearic acid and hexabromocyclodecane are preferred.

Other examples include bromides such as 1-bromo-2-butanol, 1-bromo-2-propanol, 3-bromo-1-propanol, 3-bromo-1,2-propanediol, 1,4-dibromo-2-butanol, 1,3-dibromo-2-propanol, 2,3-dibromo-1-propanol, 1,4-dibromo-2,3-butanediol, 2,3-dibromo-2-butene-1,4-diol, 1-bromo-3-methyl-1-butene, 1,4-dibromobutene, 1-bromo-1-propene, 2,3-dibromopropene, ethyl bromoacetate, ethyl α-bromocaprylate, ethyl α-bromopropionate, ethyl β-bromopropionate, ethyl α-bromoacetate, 2,3-dibromosuccinic acid, 2-bromosuccinic acid, 2,2-bromoadipic acid, 2,4-dibromoacetophenone, 1,1-dibromotetrachloroethane, 1,2-dibromo-1-phenylethane and 1,2-dibromostyrene, and compounds resulting from the displacement of bromine in these compounds by chlorine and iodine, however, the present invention is by no means limited to these examples.

The amount of the organic halogen compound added is suitably from 0.02 to 20% by weight, preferably from 0.05 to 5% by weight, based on the total amount of flux.

As the resin component blended into the flux and the solder paste of the present invention, conventionally well-known resin blended in the flux and the solder such as a natural rosin, disproportionated rosin, polymerized rosin or modified rosin, a synthetic resin such as polyester, polyurethane or acrylic resin, or the like may be used.

Particularly, a rosin having an acid value of from 150 to 250, and preferably from 150 to 240, and a softening point of from 120 to 200° C., and preferably from 120 to 140° C. is added as the resin component to the flux and the solder paste. The amount of the rosin added is, in terms of the ratio to all rosins contained in the flux, preferably 30% by weight or more, and more preferably 40% by weight or more, and in terms of the ratio to the total amount of the flux, preferably from 20 to 60% by weight, and more preferably from 40 to 55% by weight.

The "acid value of rosin" means a milligram number of potassium hydroxide (KOH) which is necessary for neutralizing the free fatty acid contained in 1 g of rosin.

The softening point of rosin is measured using a softening point measuring apparatus (according to ASTM No. D36 and DIN 1995). The acid value of rosin is measured according to DIN 55935, where 0.6 g of a rosin is dissolved in 50 ml of a (1:1) mixed solution of neutral ethanol (95%) and benzene and titrated with 0.1 N KOH using phenol phthalein as an indicator.

As the solvent, alcohol, ether, ester or an aromatic solvent may be used like in conventional solder fluxes and solder pastes. Examples thereof include benzyl alcohol, butanol, ethyl cellosolve, butyl cellosolve, butyl carbitol, diethylene glycol monohexylether, propyleneglycol monophenylether, dioctyl phthalate and xylene. These solvents may be used individually or as a mixture thereof.

The thixotropic agent added to improve the printing property may be an inorganic compound such as fine silica particles or kaolin particles, or an organic compound such as hydrogenated castor oil or an amide compound.

The flux of the present invention may consists of, based on the total amount of the flux, from 20 to 60% by weight of a resin component, from 0.04 to 20% by weight of a thixotropic agent, from 0.01 to 20% by weight of an organic acid component, from 0.02 to 20% by weight of an organic halogen compound, from 0.05 to 20% by weight of a reducing agent, and a solvent as the remaining part. The solder paste of the present invention is obtained by mixing from 8 to 14% by weight of the flux, based on the total amount of the solder paste, with from 86 to 92% by weight of the solder powder. The mixing is performed using a known apparatus such as a planetary mixer.

In the preparation and kneading of blended matter, the moisture of the flux or the humidity in the atmosphere is controlled so that the water content of the solder paste is preferably 0.5% by weight or less, and more preferably 0.3% by weight or less. If the water content in the solder paste exceeds 0.5% by weight, dissociation of the halogen from the organic base hydrohalogenated acid salt may be accelerated and the halogen generated may react with the solder metal powder, therefore, the water content is preferably 0.5% by weight or less.

The pH of the solder paste is adjusted to a predetermined range of from 4 to 9, and preferably from 6 to 8 so as to inhibit the reaction of the solder powder and the flux. In this case, any amine compounds such as alkanolamines, aliphatic primary, secondary or tertiary amines, aliphatic unsaturated amines, alicyclic amines and aromatic amines may be used as the pH adjusting agent.

Specific examples of the amine compound include ethanolamine, butylamine, aminopropanol, polyoxyethylene oleylamine, polyoxyethylene laurylamine, polyoxyethylene stearylamine, diethylamine, triethylamine, methoxypropylamine, dimethylaminopropylamine, dibutylaminopropylamine, ethylhexylamine, ethoxypropylamine, ethylhexyloxypropylamine, bispropylamine, isopropylamine and diisopropylamine.

The amount of the amine compound used is preferably from 0.05 to 20% by weight based on the total amount of the flux in the solder paste. If the amount used is less than 0.05% by weight, the effect as the pH adjusting agent is not satisfactory, whereas if it exceeds 20% by weight, the pH generally exceeds 9 and is shifted to the alkali side and, moreover, a problem that the solder paste becomes hygroscopic arises.

In order to prevent the circuit copper from rusting, azoles such as benzotriazole, benzimidazole or tolyltriazole may be further added to the flux. The amount of the rust inhibitor is added preferably from 0.05 to 20% by weight based on the total amount of the flux.

The flux can be applied to as to liquid flux for flow or as a flux-cored solder. When used as liquid flux, the flux may be used after diluting it to from 40 to 70% by weight using isopropyl alcohol as the solvent. When used as a flux-cored solder, the solvent is not used and the materials (except for a solvent) are mixed at a temperature higher than the softening point of rosin and then solidified at room temperature, thereby enabling use as a flux-cored solder.

The flux and the solder paste of the present invention are suitably used when a board such as a joint product is manufactured by connecting a printed wiring board and electronic parts. In the method of using the flux and the solder paste, and the manufacturing method of a joint product for electronic parts of the present invention, for example, in the case of the solder paste, the solder paste is coated by a printing method or the like onto the portion to be soldered, electronic parts are placed thereon, and the entire assembly is heated to melt the solder particles and then solidified, and thereby the electronic parts are soldered to the board.

As a connecting method (or a mounting method) for the board and electronic parts, for example, an SMT (surface mount technology) can be used. In the mounting method, the solder paste is coated by a printing method onto the portion of a board such as a wiring board to be soldered, electronic parts such as tip parts and QFP are placed thereon, and the entire assembly is heated by the reflow heat source, and thereby the electronic parts are soldered to the board. The reflow heat source includes a hot blast stove, an infrared stove, a refrigerator for soldering, a device for light beam soldering, and the like.

The reflow process of the present invention is performed according to the solder alloy composition, in the case of an Sn—Zn system such as 91Sn/9Zn, 89Sn/8Zn/3Bi, or 86Sn/8Zn/6Bi, a two step process of preheating and reflow is preferred. The preheating temperature is from 130 to 180° C., and preferably from 130 to 150° C.; the preheating time is from 60 to 120 seconds, and preferably from 60 to 90 seconds; the reflow temperature is from 210 to 230° C., and preferably from 210 to 220° C.; and the reflow time is from 30 to 60 seconds, preferably from 30 to 40 seconds. Furthermore, the reflow temperature in another alloy composition is from +20 to +50° C., and preferably from +20 to +30° C. based on the melting point of the alloy used, and the preheating temperature, the preheating time, and reflow time are preferably limited to within the above ranges.

By using the solder paste of the present invention, the above reflow process can be performed under either nitrogen or air. When the reflow is performed under nitrogen, the oxygen concentration is 5% by volume or less, and preferably 0.5% by volume so as to improve the wettability of the solder to the board such as a wiring board in comparison with the reflow under air and to prevent the generation of solder balls, and thereby the solder paste can be treated under stable conditions.

The surface mounting is concluded by cooling the above-mentioned board. In the manufacturing method of electronic parts soldered to the board by the mounting method, the electronic parts may be soldered to both sides of the board such as a printed wiring board. The electronic parts which can be used with the solder paste of the present invention are LSIs, resistors, capacitors, trances, inductance, filters, oscillators, and the like, however, the present invention is by no means limited to these examples.

In the present invention, a more superior soldering property is obtained when the solder paste of the present invention is mounted by an SMT on the circuit board ("Super Juffit Method" which is disclosed in Japanese Unexamined Patent Application, First Publication, No. Hei 7-7244) after the steps of forming a tacky film by chemical reaction only on a predetermined surface of the board (for example, a predetermined surface of a metal circuit of the printed board), adhering the solder powder to the tacky film, coating the flux thereon, causing it to reflow by heating it at the melting temperature of the solder, and forming the solder bump on the circuit board.

By using the flux and a solder paste comprising the flux, the present invention can improve properties such as the reflow property, solderability, wettability to a metal to be welded, and the printing property; the generation of the solder balls at reflow is reduced; and the flux and the solder paste can be used into Pb-free solder alloies. Furthermore, the present invention obtains a fine pitch joint product for electronic parts, for example, a fine pitch mounting wiring board, by using the Pb-free solder alloy to decrease environmental pollution by wastes; responds to the diversification of parts; and thereby provides a wiring board whose parts have an excellent life-time.

EXAMPLES

The present invention is described in greater detail below by referring to Examples, however, the present invention is by no means limited to these examples.

(1) Distribution of Fine Particles by Number in Solder Powder

A Coulter Counter manufactured by Coulter, Inc. (multisizer II type) was used to determine the distribution of fine particles by number in the solder powder. The dispersion was prepared by dispersing 1 g of the solder powder into 100 ml of NaCl electrolyte solution (1% by concetration), which was then placed in a detector with a detector tube of 400 $\mu$m pore in size, and the distribution of fine particles having 1 $\mu$m or more in size by number in the solder powder was determined.

(2) Oxygen Concentration

An oxygen analyzer (infrared-absorbing analysis method) manufactured by Reco Co. was used to measure the oxygen concentration.

(3) Moisture

After the preparation of solder paste, the moisture in the paste was measured using Karl Fischer's method. More specifically, the paste was placed in a moisture vaporizer (ADP-351, manufactured by Kyoto Denshi Kogyo K.K.), vaporized by heating at 150° C., and introduced into a Karl Fischer's moisture meter (MKC-210, manufactured by Kyoto Denshi Kogyo K.K.) using nitrogen as the carrier gas. Then, the moisture in the vapor was measured.

(4) pH

The solution was prepared by dissolving 4 g of the flux into a mixture of 50 ml of toluene, 49.5 ml of isopropylalcohol, and 0.5 ml of water and then the pH was measured using a pH meter. In the case of the solder paste, the solder paste corresponding to 4 g of the flux was measured.

(5) Storage Stability of Solder Paste

The storage stability was evaluated by performing an acceleration test such that the solder paste was produced and then stored at 25° C. for 7 days and then measuring the decomposition ratio of organic halogen compound immediately after the production of solder paste and the amount of hydrogen generated. The acceleration test conditions in this evaluation roughly correspond to cold storage at 5° C. for 3 months.

The decomposition ratio of organic halogen compound was measured by ion chromatography after stirring 1 g of the paste with 5 ml of chloroform to dissolve the flux component and then extracting the halogen ions from the flux with 10 ml of pure water.

The amount of hydrogen generated was measured by charging 50 g of the solder paste prepared into a 100 ml-volume test tube, sealing the test tube with a silicone rubber plug, storing it at 25° C. for 7 days, sampling the vapor through the rubber plug, and then subjecting it to gas chromatography. Then the hydrogen concentration was measured.

(6) Observation of Voids (Solderability)

A 150 $\mu$m-thick metal mask was applied to a 60 mm square copper plate, 6 mm (diameter)×6 patterns were printed thereon, the plate was treated by a reflow in atmospheric air, and the copper plate was sectioned together with the solder by a cutter. The solder part was observed through a microscope and the void generation status was examined. In six patterns, a void of 10 $\mu$m or more in size was measured, if average number of voids of 10 $\mu$m or more in size per one pattern was two, the sample was rejected.

(7) Printing Property

The printing property was measured using M3 in Appendix 5 of JIS Z-3284 (pattern configuration: pore width 0.25 mm, length 2.0 mm, and pitch 0.50 mm) and evaluated by observing it through a stereomicroscope. When thinning or pad breakage occurred, the sample was rejected even if it was one pad.

(8) Tackiness

Tackiness was determined by a Malcom-type tackiness tester. The tackiness was determined by printing the solder paste on a glass plate using a metal mask so as to form 5 circular patterns having diameters of 6.5 mm and thicknesses of 0.2 mm. After allowing the patterns to stand at 25° C. and 50% humidity for 3 hours, a measuring probe was fitted to one pattern, a pressure of up to 50 g was applied at a speed of 2 mm/sec, and then the load required to pull up/peel off the pattern at a speed of 10 mm/sec and within 0.2 seconds was measured. An average load of five measurements made using this method of 100 g or more was rated as acceptable.

(9) Solder Ball

This was evaluated according to JIS Z-3284. The solder paste was printed to an alumina test panel using a metal mask so as to form four circular patterns having diameters of 6.5 mm and thicknesses of 0.2 mm. The alumina test panel was dried at 150° C. for one minute, heated up to 235° C. so as to fuse the solder onto the panel, the board was pulled out horizontally within 5 seconds thereafter. The board was left in a horizontal state until the solder on the board solidified, thereafter, the appearance of the solder was observed through a 20× magnifying glass and the generation of solder particles (solder balls) in the periphery was examined through a 50× magnifying glass. Those where the generation state of solder balls was 1.2 according to the criteria of JIS Z-3284 were rated acceptable.

(10) Wet Spreading Property

The wet spreading property was determined according to JIS Z-3284. The solder paste was printed to a copper or brass test panel using a metal mask so as to form four circular patterns having diameters of 6.5 mm and thicknesses of 0.2 mm. The copper or brass test panel was dried at 150° C. for one minute, heated up to 235° C. so as to fuse the solder to the panel, the board was pulled out horizontally within 5 seconds thereafter. The board was left in a horizontal state until the solder on the board solidified, thereafter, the wet spreading property of the solder was observed. The wet spreading property was determined according to the JIS Z-3284 standard, 1 or 2 was rated as a pass.

Examples 1 to 20, Comparative Examples 1 to 4
Preparation of Flux and Solder Paste Fluxes were prepared by blending 27.5% by weight of disproportionated rosin having an acid value of 80 and a softening point of 70° C.; and 17.5% by weight of polymerized rosin having an acid value of 150 and a softening point of 120° C. as resin components; 6% by weight of hydrogenated castor oil as a thixotropic agent; 0.5% by weight of t-butyl acetate, t-butyl malonate, i-butyl benzoate, n-propyl paratoluenesulfonate, i-butyl salicylate, i-butyl laureate or t-butyl bromoacetate as an organic acid ester, 0.08% by weight of cyclohexylamine hydrobromide or 1,3-diphenylguanidine hydrobromide as an ester decomposer catalyst; 3.5% by weight of hexabromocyclododecane, hexabromostearic acid, methyl hexabromostearate, tetrabromostearic acid, 2,2-dibromoadipic acid, t-butyl bromoacetate or 2,3-dibromosuccinic acid as an organic halogen compound, 1.0% by weight of hydroquinone, triphenylphosphite, tocopherol, ascorbyl-2,6-dipalmitate, trioctadecylphosphite, distearyl 3,3'-thiodipropionate; a 1:1 (by weight) mixture of tocopherol and ascorbyl-2,6-dipalmitate, a 1:1:1 (by weight) mixture of tocopherol acetate, ascorbyl-2,6-dibutylate and lecithin, nicotinic acid tocopherol ester or ascorbyl-2-glucoside-6-myristilate as a reducing agent; 1% by weight of tolyltriazole as a rust inhibitor, 2% by weight of triethylamine as a pH adjusting agent, and propylene glycol monophenylether as a solvent added to make 100% by weight.

To 11% by weight of each flux, 89% by weight of Pb-free 89Sn/8Zn/3Bi solder powder having a particle size of from 20 to 45 µm (content of particles of 45 µm or less: 97% by weight) and having the distribution of fine particles by number shown in Table 2 was added and kneaded in a planetary mixer to prepare 3 kg of solder paste. The blended components are shown in Table 1, the distribution of fine particles by number in solder powder used, oxygen concentration in the solder powder, moisture in the solder paste and determined pH value of the flux are shown in Table 2.

Preparation of Joint of Circuit Board and Electronic Parts

SMT was used as a mounting method. Solder pastes having the compositions of Examples 1 to 20 and Comparative Examples 1 to 4 were printed onto one sheet of circuit board, and LSI, chip resistor and chip capacitor were placed on the solder paste and soldered by heating the assembly by a reflow heat source. A hot blast stove was used as the reflow heat source.

The reflow was performed under conditions such that the preheating temperature was 130° C., the preheating time was 80 seconds, the reflow peak temperature was 220° C. and the reflow time at 200° C. or more was 50 seconds.

Properties of prepared printing wired board and the used solder paste were determined by the above-mentioned measuring methods. The measurement results are shown in Table 3.

In Examples 1 to 20, when the amount of organic halogen compound blended was fixed at 3.5% by weight based on the total amount of the flux and the amount of reducing agent added was changed to 1.0%, the generation of hydrogen could be suppressed to 4% or less and the generation of voids could be more greatly prevented.

Furthermore, the flux and the solder paste were prepared by using Pb-free solder powder having a composition of 91Sn/9Zn or 89Sn/8Zn/3Bi and the properties thereof were determined by the same methods, so that the same results were obtained.

The solder alloy compositions after the reflow of Examples 1 to 20 and the solder alloy compositions of conventional Sn—Pb system solder pastes were compared. As a result, in the case of Sn—Pb systems, very coarse crystals were grown in a high temperature environment, whereas the growth of coarse crystals was reduced when the flux of the present invention and the Sn—Zn system alloys were used. From this, it was verified that the mechanical properties of the solder were improved and the life property of the mounted wiring boards was improved.

TABLE 1

| Example | Organic Halogen Compound | Reducing Agent | Organic Acid Ester | Ester Decomposer Catalyst |
|---|---|---|---|---|
| 1 | hexabromocyclododecane | hydroquinone | t-butyl acetate | cyclohexylamine.HBr |
| 2 | hexabromocyclododecane | hydroquinone | t-butyl malonate | cyclohexylamine.HBr |
| 3 | hexabromocyclododecane | triphenylphosphite | i-butyl benzoate | cyclohexylamine.HBr |
| 4 | hexabromocyclododecane | triphenylphosphite | t-butyl bromoacetate | cyclohexylamine.HBr |
| 5 | hexabromostearic acid | tocopherol | n-propyl p-toluenesulfonate | diphenylguanidine.HBr |
| 6 | hexabromostearic acid | ascorbyl-,6-dipalmitate | n-propyl p-toluenesulfonate | diphenylguanidine.HBr |
| 7 | hexabromostearic acid | tocopherol | n-propyl p-toluenesulfonate | cyclohexylamine.HBr |
| 8 | tetrabromostearic acid | trioctadecylphosphite | i-butyl salicylate | cyclohexylamine.HBr |

TABLE 1-continued

| | Organic Halogen Compound | Reducing Agent | Organic Acid Ester | Ester Decomposer Catalyst |
|---|---|---|---|---|
| 9 | 2,2-dibromoadipic acid | distearyl 3,3'-thiodipropionate | i-butyl laurate | cyclohexylamine.HBr |
| 10 | t-butyl bromoacetate | tocopherol | n-propyl p-toluenesulfonate | cyclohexylamine.HBr |
| 11 | 2,3-dibromosuccinic acid | tocopherol | n-propyl p-toluenesulfonate | cyclohexylamine.HBr |
| 12 | hexabromostearic acid | tocopherol + ascorbyl-2,6-dipalmitate | n-propyl p-toluenesulfonate | diphenylguanidine.HBr |
| 13 | hexabromostearic acid | tocopherol | none | none |
| 14 | hexabromostearic acid | tocopherol | none | none |
| 15 | hexabromostearic acid | tocopherol | none | none |
| 16 | hexabromostearic acid | tocopherol | none | none |
| 17 | hexabromostearic acid | tocopherol + ascorbyl-2,6-dipalmitate | n-propyl p-toluenesulfonate | diphenylguanidine.HBr |
| 18 | methyl hexabromostearate | tocopherol acetate + ascorbyl-2,6-dibutylate + lecithin | n-propyl p-toluenesulfonate | diphenylguanidine.HBr |
| 19 | methyl hexabromostearate | nicotinic acid tocophrol | i-butyl laurate | cyclohexylamine.HBr |
| 20 | hexabromocyclododecane | ascorbyl-2-glucocide-6-myristate | t-butyl bromoacetate | diphenylguanidine.HBr |
| Comparative Example | | | | |
| 1 | 2,3-dibromosuccinic acid | none | none | none |
| 2 | 2,3-dibromosuccinic acid | none | none | none |
| 3 | t-butyl bromoacetate | none | none | none |
| 4 | t-butyl bromoacetate | none | none | none |

TABLE 2

| | Distribution of Fine Particles by Number in Solder Powder (% by number) | | Oxygen Content (ppm) | Moisture (% by weight) | pH |
|---|---|---|---|---|---|
| | 10 μm or less | 20 μm or less | | | |
| Example | | | | | |
| 1 | 15.0 | 28.8 | 160 | 0.19 | 8.5 |
| 2 | 10.2 | 14.5 | 132 | 0.13 | 5.0 |
| 3 | 18.3 | 27.1 | 208 | 0.45 | 5.0 |
| 4 | 12.8 | 18.3 | 154 | 0.32 | 6.0 |
| 5 | 16.4 | 25.1 | 183 | 0.22 | 6.0 |
| 6 | 13.8 | 20.1 | 156 | 0.16 | 5.5 |
| 7 | 16.8 | 24.3 | 196 | 0.29 | 4.5 |
| 8 | 11.4 | 16.8 | 129 | 0.36 | 5.5 |
| 9 | 13.8 | 19.1 | 163 | 0.34 | 6.0 |
| 10 | 16.8 | 25.6 | 221 | 0.42 | 6.5 |
| 11 | 18.1 | 28.1 | 251 | 0.40 | 4.5 |
| 12 | 10.8 | 15.1 | 130 | 0.11 | 7.5 |
| 13 | 19.3 | 29.1 | 495 | 0.51 | 3.7 |
| 14 | 19.2 | 29.5 | 142 | 0.42 | 3.5 |
| 15 | 11.0 | 16.5 | 205 | 0.48 | 6.0 |
| 16 | 19.1 | 29.9 | 495 | 0.11 | 8.5 |
| 17 | 15.4 | 29.4 | 485 | 0.49 | 3.7 |
| 18 | 12.9 | 25.8 | 213 | 0.25 | 7.3 |
| 19 | 17.1 | 22.9 | 169 | 0.31 | 5.9 |
| 20 | 14.2 | 20.5 | 463 | 0.41 | 6.4 |
| Comparative Example | | | | | |
| 1 | 20.3 | 45.1 | 290 | 0.60 | 6.0 |
| 2 | 22.0 | 50.0 | 520 | 0.61 | 5.5 |
| 3 | 21.5 | 35.9 | 444 | 0.72 | 3.2 |
| 4 | 23.9 | 28.6 | 503 | 0.53 | 4.6 |

TABLE 3

| | Br Decomposition Ratio (%) | | Amount of Hydrogen Generated (% by weight) | Void Generation State | Viscosity (PA · s) | | Printing Property | Tackiness | Solder Ball | Wet Spreading Property |
|---|---|---|---|---|---|---|---|---|---|---|
| | Initial | After 7 days | | | Initial | After 7 days | | | | |
| Example | | | | | | | | | | |
| 1 | 33.4 | 36.5 | 1.77 | ○ | 231 | 239 | ○ | ○ | ○ | ○ |
| 2 | 23.5 | 32.5 | 0.75 | ○ | 199 | 219 | ○ | ○ | ○ | ○ |
| 3 | 42.2 | 43.5 | 1.15 | ○ | 199 | 226 | ○ | ○ | ○ | ○ |

TABLE 3-continued

| | Br Decomposition Ratio (%) Initial | Br Decomposition Ratio (%) After 7 days | Amount of Hydrogen Generated (% by weight) | Void Generation State | Viscosity (PA · s) Initial | Viscosity (PA · s) After 7 days | Printing Property | Tackiness | Solder Ball | Wet Spreading Property |
|---|---|---|---|---|---|---|---|---|---|---|
| 4 | 12.1 | 15.2 | 0.65 | ○ | 196 | 215 | ○ | ○ | ○ | ○ |
| 5 | 12.9 | 13.2 | 0.95 | ○ | 174 | 181 | ○ | ○ | ○ | ○ |
| 6 | 14.8 | 15.1 | 0.58 | ○ | 187 | 209 | ○ | ○ | ○ | ○ |
| 7 | 13.2 | 18.9 | 1.87 | ○ | 209 | 228 | ○ | ○ | ○ | ○ |
| 8 | 11.3 | 15.6 | 0.95 | ○ | 191 | 215 | ○ | ○ | ○ | ○ |
| 9 | 27.8 | 43.5 | 1.56 | ○ | 211 | 221 | ○ | ○ | ○ | ○ |
| 10 | 25.2 | 31.5 | 1.39 | ○ | 174 | 202 | ○ | ○ | ○ | ○ |
| 11 | 18.3 | 21.5 | 1.02 | ○ | 197 | 210 | ○ | ○ | ○ | ○ |
| 12 | 10.8 | 12.6 | 0.55 | ○ | 171 | 176 | ○ | ○ | ○ | ○ |
| 13 | 44.3 | 49.7 | 3.20 | ○ | 236 | 301 | ○ | ○ | ○ | ○ |
| 14 | 42.5 | 51.5 | 3.30 | ○ | 251 | 299 | ○ | ○ | ○ | ○ |
| 15 | 49.3 | 53.2 | 3.41 | ○ | 274 | 280 | ○ | ○ | ○ | ○ |
| 16 | 48.1 | 55.3 | 3.55 | ○ | 266 | 295 | ○ | ○ | ○ | ○ |
| 17 | 21.5 | 33.5 | 2.10 | ○ | 211 | 229 | ○ | ○ | ○ | ○ |
| 18 | 10.1 | 11.2 | 0.64 | ○ | 195 | 203 | ○ | ○ | ○ | ○ |
| 19 | 13.9 | 26.7 | 0.86 | ○ | 204 | 238 | ○ | ○ | ○ | ○ |
| 20 | 19.6 | 30.9 | 0.92 | ○ | 265 | 283 | ○ | ○ | ○ | ○ |
| Comparative Example | | | | | | | | | | |
| 1 | 100.0 | 100.0 | 8.20 | X | 335 | immeasurable | X | X | X | X |
| 2 | 100.0 | 100.0 | 7.11 | X | 351 | immeasurable | X | X | X | X |
| 3 | 100.0 | 100.0 | 5.90 | X | 385 | immeasurable | X | X | X | X |
| 4 | 100.0 | 100.0 | 6.12 | X | 350 | immeasurable | X | X | X | X |

Examples 21 to 24

Solder pastes were prepared by using of three kinds of atomized solder powders, 91Sn/9Zn, 89Sn/8Zn/3Bi, and 86Sn/8Zn/6Bi, having a particle size of 20 μm to 40 μm. The basic composition of the solder pastes was as follows: 89% by mass solder powder and 11% by mass flux. Flux, in % by mass to the total amount of flux, consisted essentially of: a resin component: disproportionated rosin 20% and polymerized rosin 30%; a thixotropic agent: hydrogenated castor oil 4%; an organic acid ester: propyl paratoluenesulfonate 0.5%; a rust preventive: tolyltriazole 0.1%; triethylamine 2%; an ester decomposition catalyst: diphenylguanidine-HBr 0.01%; an organic halogen compound 0.34% specified in Table 4; and the balance of solvent: propylene glycol monophenylether. The flux and the solder powder were mixed by use of a planetary mixer, thereby obtaining a solder paste. The thus-obtained solder paste exhibited a viscosity of about 200 Pa·s.

The solder paste was applied to a pure aluminum plate measuring 2 mm (thickness)×25 mm×25 mm at a central portion measuring 10 mm×10 mm through printing by use of a printing machine. A pure copper plate measuring 0.5 mm (thickness)×10 mm×10 mm was placed on the printed surface. Joining was performed by use of a reflow furnace. Reflow conditions were adjusted such that the preheating temperature was 150° C., and the reflow temperature (peak temperature) was 220° C., as measured at the surface of the pure copper plate. The belt speed of the reflow furnace was 0.6 m/min, the preheating time was 80 sec, and the reflow time was 3 sec. The reflow atmosphere was a nitrogen atmosphere with an oxygen concentration of 2,000 ppm.

Test samples which had undergone joining were cooled and were then cleaned by means of ethyl alcohol. The cleaned test samples were examined for voids by use of soft X-rays and was measured for joining strength. Since thermal resistance increases with the amount of voids, the test sample were evaluated according to a three-grade system (good (○), acceptable (Δ), and not acceptable (x)) on the basis of the amount of voids. The joining strength was measured in the following manner. A rivet of pure copper having an end 10 mm in diameter was bonded onto the pure copper plate of each of the test samples by means of an adhesive. The test samples were measured for tensile strength at a tension speed of 10 mm/min by use of a tension tester. Notably, when the test sample had a joining strength of at least 100 kg/cm$^2$, the test sample bent, making measurement impossible. According to common understanding, thermal resistance at the joined portion decreases with the joining strength. A practically desired joining strength is at least 30 kg/cm$^2$.

A corrosion test was conducted in the following manner on test samples which were prepared in a manner similar to that mentioned above. The test samples were not cleaned of flux and were allowed to stand at a temperature of 40° C. and a humidity of 90% for 72 hours. Subsequently, the test samples were evaluated for corrosion by use of a microscope. The criteria were as follows: defective (x) when traces (spots) of corrosion are observed; acceptable (Δ) when slight traces of corrosion are observed; and good (○) when no corrosion is observed. Test results are shown in Table 4.

TABLE 4

| Ex. | Alloy Composition | Organic Halogen Compound | Joined Materials | Voids | Tensile Strength (kg/cm$^2$) | Corrosion |
|---|---|---|---|---|---|---|
| 21 | 89Sn—8Zn—3Bi | hexabromostearic acid | Al/Cu | ○ | 100 or higher | ○ |
| 22 | 89Sn—8Zn—3Bi | hexabromostearic acid | Al/Al | ○ | 100 or higher | ○ |
| 23 | 86Sn—8Zn—6Bi | hexabromostearic acid | Al/Cu | ○ | 100 or higher | ○ |
| 24 | 91Sn—9Zn | hexabromostearic acid | Al/Cu | ○ | 100 or higher | ○ |

Example 25

Figure 1:
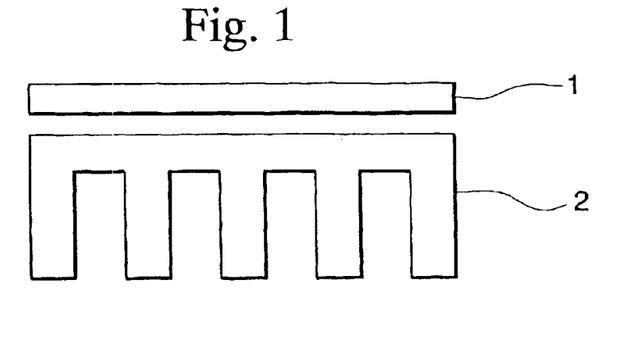
FIG. 1 is a cross-sectional view of a copper plate and a aluminum heat sink according to an example of joining method of the present invention.

Through use of the solder paste of the composition of Example 21 (basic composition: 89% by mass 89Sn/8Zn/3Bi solder powder having a grain size of 20–40 μm and 11% by mass flux; flux, in % by mass to the total amount of flux, consisted essentially of: disproportionated rosin 20%; polymerized rosin 30%; hydrogenated castor oil 4%; propyl paratoluenesulfonate 0.5%; tolyltriazole 0.1%; triethylamine 2%; diphenylguanidine.HBr 0.01%; hexabromostearic acid 0.34%; and a balance of propylene glycol monophenylether), a copper plate 1 measuring 2 mm (thickness)×25 mm×60 mm and a heat sink 2 of aluminum were joined as shown in FIG. 1. The solder paste was applied to the entire surface-subjected-to joining of the aluminum heat sink by printing. Next, the copper plate was bonded to the aluminum heat sink through utilization of adhesion of the applied solder paste. Joining was performed by use of the reflow furnace. Reflow conditions were adjusted such that the preheating temperature was 150° C., and the peak temperature (reflow temperature) was 220° C., as measured at the surface of the copper plate. The belt speed of the reflow furnace was 0.6 m/min, the preheating time was 80 sec, and the reflow time was 3 sec. The oxygen concentration of the reflow atmosphere was 2,000 ppm.

The test sample which had undergone joining was examined for voids by use of soft X-rays. No voids were observed.

Example 26

Figure 2:
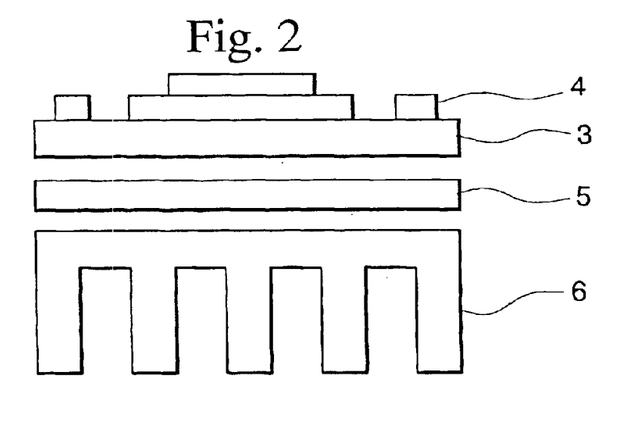
FIG. 2 is a cross-sectional view of an alumina substrate on which electronic parts are mounted, a copper plate, and an aluminum heat sink according to another example of joining method of the present invention.

As shown in FIG. 2, an alumina substrate 3, on one side of which were mounted electronic parts 4 and the other side of which was metallized with molybdenum, a copper plate 5, and an aluminum heat sink 6 were joined to thereby fabricate a high power module. A circuit made from the copper plate having a thickness of 0.3 mm was formed on the surface of the alumina substrate 3, and the electronic parts 4 were mounted on the copper circuit.

The solder paste of Example 6 was applied to the metallized surface of the alumina substrate 3 (the metallized surface is opposite the surface on which the electronic parts 4 are mounted). The copper plate 5 measuring 2 mm (thickness)×25 mm×60 mm was bonded to the metallized surface by utilization of adhesion. As shown in FIG. 2, this assembly of the alumina substrate 3 and the copper plate 5 was placed on the surface-subjected-to-joining of the aluminum heat sink 6 to which the solder paste of the composition of Example 21 is applied.

Joining was performed by use of the reflow furnace. Reflow conditions were adjusted such that the preheating temperature was 150° C., and the peak temperature was 220° C., as measured on the surface of the copper plate 5. The belt speed of the reflow furnace was 0.6 m/min, the preheating time was 80 sec, and the reflow time was 3 sec. The oxygen concentration of the reflow atmosphere was 2,000 ppm.

The test sample which had undergone joining was examined for voids by use of soft X-rays. No voids were observed.

Examples 27 to 29

Solder pastes were prepared by using of three kinds of atomized solder powders, 91Sn/9Zn, 89Sn/8Zn/3Bi, and 86Sn/8Zn/6Bi, having a particle size of 20–40 μm. Composition of the solder pastes was as follows: 89% by mass solder powder and 11% by mass flux. Flux, in % by mass to the total amount of flux, consisted essentially of: a resin component: disproportionated rosin 20% and polymerized rosin 30%; a thixotropic agent: hydrogenated castor oil 4%; an organic acid ester: propyl paratoluenesulfonate 0.5%; a rust preventive: tolyltriazole 0.1%; triethylamine 2%; an ester decomposition catalyst: diphenylguanidine.HBr 0.01%; an organic halogen compound 0.34% specified in Table 5; and the balance of solvent: propylene glycol monophenylether. The flux and the solder powder were mixed by use of a planetary mixer, thereby yielding a solder paste. The thus-obtained solder paste exhibited a viscosity of about 200 Pa·s.

The solder paste was applied to pads of Al pattern wiring on 5-inch Si wafers by use of a printing machine. 10,000 pads of Al wiring 2.0 m thick and measuring 200 m×300 m were formed with a space of 0.5 mm between neighboring pads by a sputtering method. Furthermore, a printing mask 200 m thick and measuring 300 m×300 m was prepared, although the pad of Al wiring measured 200 m×300 m. The aperture size of the printing mask was adjusted to be larger than the size of the pad to increase the amount of the paste for application so that a bump electrode formed after reflow had a desired value of 80 m in height.

After printing, the solder paste was dissolved by use of a reflow furnace. Reflow conditions were adjusted such that the preheating temperature was 150° C., and the reflow temperature (peak temperature) was 220° C. under the reflow atmosphere of a nitrogen atmosphere having an oxygen concentration of 100 ppm. The belt speed of the reflow furnace was 0.6 m/min, the preheating time was 80 sec, and the reflow time was 3 sec.

After reflowing, the solder paste was cleaned to remove flux by means of ethyl alcohol. The cleaned solder paste was evaluated for the following characteristics.

(1) Height of Bump Electrode

An average value of heights of 50 bump electrodes per sample was measured by means of a three-dimensional measuring device. If the height was between 70 μm to 90 μm, the bump electrode was evaluated as being acceptable.

(2) Appearance Observation

Appearance observation of the bump electrodes was conducted by observing through a 20× magnifying glass. If there were no bridges or nicks, the bump electrode was evaluated as being acceptable, and if there were bridges or nicks, the bump electrode was evaluated as being not acceptable.

(3) Solder Ball

The bump electrode was observed through a 20× magnifying glass to examine the generation of solder balls. If there were no solder balls, the bump electrode was evaluated as being acceptable, and if one or more solder balls were observed, the bump electrode was evaluated as being not acceptable.

(4) Rupture Test

The bump electrode was ruptured by adding shearing force by means of a universal bonding tester so as to measure rupture strength. Furthermore, the ruptured faces were observed through a 20× magnifying glass so as to find ruptured regions. If a rupture is generated on the soldered surface, joint strength is high, and if a rupture is generated on the interface between the solder and the pad, joint strength is low.

The results are shown in Table 5. ○ means acceptable and × means not acceptable.

TABLE 5

| Example | 27 | 28 | 29 |
|---|---|---|---|
| Silicon Chip Side | | | |
| Alloy Composition | 89Sn/8Zn/3Bi | 86Sn/8Zn/6Bi | 91Sn/9Zn |
| Organic Halogen Compound | hexabromostearic acid | hexabromostearic acid | hexabromostearic acid |
| Height of Bump Electrode | 79 | 81 | 77 |
| Appearance | ○ | ○ | ○ |
| Solder Balls | ○ | ○ | ○ |
| Ruptured Part | Soldered surface | Soldered surface | Soldered surface |
| Rupture Strength (Kg) | 5.5 | 5.8 | 5.6 |

Examples 30 to 32

The solder pastes were applied on 5-inch Si wafers under the conditions of Example 27 so as to form bump electrodes. The wafer was subjected to dicing to 10 mm×10 mm so as to prepare Si chips.

As a substrate for joining the above Si chips, a glass epoxy resin substrate 15 mm×15 mm and 0.8 mm thick was used. In the substrate, the solder pastes of 89Sn/8Zn/3Bi, 86Sn/8Zn/6Bi, and 91Sn/9Zn were precoated on Cu electrodes having the same pattern as the Si chip by means of Super Juffit Method. The precoated solder was between 25 μm to 30 μm thick. A prepared Si chip and a precoated circuit board are schematically shown in FIG. 3.

Figure 3:
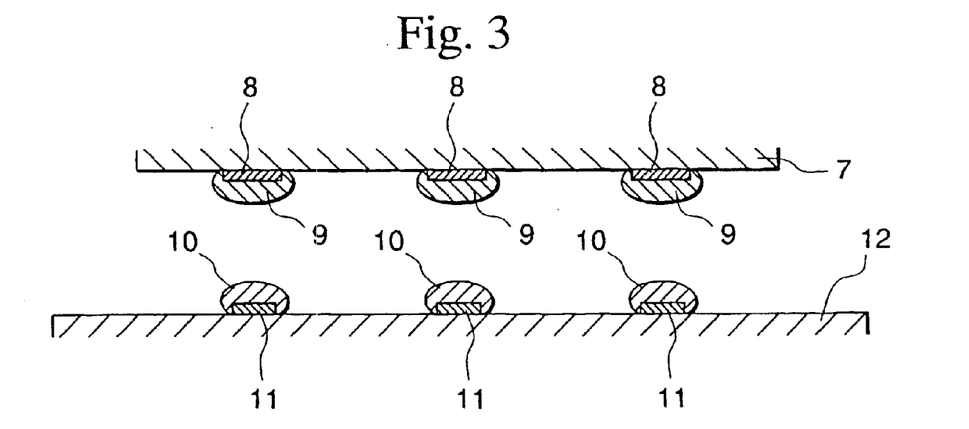
FIG. 3 is a cross-sectional view of solder bump electrodes on a Si chip and solder metal coated electrodes on a circuit board according to the present invention.

Si chip 7 and circuit board 12 were joined by the following steps: overlapping a pattern of solder bump electrode 9 on Si chip 7 on a pattern of metal coated solder electrode 10 on glass epoxy resin circuit board 12 (FIG. 3 shows solder bump electrode 9 covering aluminum electrode 8 on Si chip 7 being opposed to metal coated solder electrode 10 covering copper electrode 11 on glass epoxy resin circuit board 12 before overlapping them); melting the solder paste in a joining furnace using reduced ammonia gas with a preheating temperature of 150° C. for two minutes and a joining temperature of 220° C. for five seconds; and joining solder bump electrode pattern 9 and metal coated solder electrode 10. After joining, the joining electrodes were cut by a diamond cutter, and the face of the joint part was evaluated as follows.

(1) Gap Distance

The distance between the Si chip at the joint part and the glass epoxy resin substrate (gap distance) was measured using a 20× magnifying glass. When the gap distance was between 70 μm to 100 μm, the joint was evaluated as being acceptable.

(2) Observation of Joint Condition

The joint condition was examined by use of soft X-rays. When cracks and bridges were not observed at the joint, the joint was evaluated as being acceptable.

The results are shown in Table 6. ○ means acceptable and × means not acceptable.

TABLE 6

| Example | 30 | 31 | 32 |
|---|---|---|---|
| Substrate Side | | | |
| Alloy Composition | 89Sn/8Zn/3Bi | 86Sn/8Zn/6Bi | 91Sn/9Zn |
| Thickness (μm) After Joining | 27 | 26 | 28 |
| Gap Distance (μm) | 79 | 88 | 91 |
| Observation by Soft X-rays | ○ | ○ | ○ |

By using the solder paste of the present invention, superior solder bump electrodes are formed in which heights of bump electrodes are uniform and there are no bridges, nicks, solder balls. In particular, when at least one of a bromide of a benzyl compound containing a substituent having an alkyl chain with a carbon number of 10 or more, and a polybromine compound containing a fatty acid or an alicyclic compound with a carbon number of 10 or more, wherein the polybromine comprises four or more bromine atoms in one molecule, was added to the solder paste as an organic halogen compound, solder bump electrodes having high rupture strength were obtained. Furthermore, in the joint produced between the Si chip and the substrate, an excellent joining condition in which the gap distance is uniform and there are no cracks or bridges was obtained.

What is claimed is:

1. A flux for solder paste comprising an organic acid component consisting of an organic acid ester and an ester decomposer catalyst, an organic halogen compound, a reducing agent, and a resin component.

2. The flux for solder paste according to claim 1, wherein the ester decomposer catalyst is an organic base hydrohalogenated acid salt.

3. The flux for solder paste according to claim 1, wherein the organic halogen compound comprises at least one of a bromide of a benzyl compound containing a substituent having an alkyl chain with a carbon number of 10 or higher, and a polybromine compound containing a fatty acid or an alicyclic compound with a carbon number of 10 or higher wherein the polybromine comprises four or more bromine atoms in one molecule.

4. The flux for solder paste according to claim 1, wherein the reducing agent is at least one selected from the group consisting of phenol compounds, phosphorus compounds, sulfur compounds, lecithin, tocopherol, tocopherol derivatives, ascorbic acid and ascorbic acid derivatives.

5. The flux for solder paste according to claim 1, wherein the reducing agent is a combination of at least one of tocopherol and a tocopherol derivative with at least one of ascorbic acid and an ascorbic acid derivative.

6. The flux for solder paste according to claim 4 and 5, wherein the tocopherol derivative is selected from the group consisting of acetic acid tocopherol ester and nicotinic acid tocopherol ester.

7. The flux for solder paste according to claim 4 or 5, wherein the tocopherol derivative is selected from the group consisting of phosphoric acid tocopherol ester and sorbic acid tocopherol ester.

8. The flux for solder paste according to claim 4 or 5, wherein the tocopherol derivative is selected from the group consisting of tocol and tocopherol derivatives containing at least one of the following structures and wherein in the above structures, $R=C_nH_{2n+1}$ (n=1 to 16).

9. The flux for solder paste according to claim 4 or 5, wherein the ascorbic acid derivative is selected from the group consisting of ascorbyl-2,6-dibutylate, ascorbyl-2,6-distearate, and ascorbic acid 2,6-dimyristilate.

10. The flux for solder paste according to claim 4 or 5, wherein the ascorbic acid derivative is selected from the group consisting of ascorbyl-2-glucoside-6-palmitate, ascorbyl-2-glucoside-6-myristilate, and ascorbyl-2-glucoside-6-stearate.

11. The flux for solder paste according to claim 4 or 5, wherein the ascorbic acid derivative is selected from the group consisting of ascorbyl-2-phosphite, ascorbyl-2-sulfate, ascorbyl-2-glucoside, ascorbyl-6-palmitate, ascorbyl-6-stearate, and ascorbyl-6-myristilate.

12. The flux for solder paste according to claim 4 or 5, wherein the ascorbic acid derivative is selected from the group consisting of ascorbyl-2,3,5,6-tetrapalmitate, ascorbyl-2,3,5,6-tetramyristilate, ascorbyl-2,3,5,6-tetrastearate, ascorbyl-5,6-o-benzylidene, ascorbyl-5,6-o-isopropylidene, ascorbyl-2-phosphite-5,6-o-benzylidene, and ascorbyl-2-phosphite-5,6-o-isopropylidene.

13. The flux for solder paste according to claim 1, wherein the resin component comprises a rosin having an acid value of from 150 to 250 and softening point of from 120 to 200° C.

14. The flux for solder paste according to claim 13, comprising the rosin in a ratio of 30% by weight or more based on the total amount of the resin component.

15. The flux for solder paste according to claim 1, which comprises, based on the total amount of the flux, 20 to 60% by weight of a resin component, 0.01 to 20% by weight of an organic acid component, 0.02 to 20% by weight of an organic halogen compound, 0.05 to 20% by weight of a reducing agent.

16. The flux for solder paste according to claim 1, which comprises a pH adjusting agent, wherein a solution prepared by dissolving 4 g of the flux comprising a pH adjusting agent in a mixture of 50 ml of toluene, 49.5 ml of isopropyl alcohol, and 0.5 ml of water, has a pH value of from 4 to 9 when measured with a pH meter.

17. The flux for solder paste according to claim 16, which comprises, based on the total amount of the flux, 20 to 60% y weight of a resin component, 0.01 to 20% by weight of an organic acid component, 0.02 to 20% by weight of an organic halogen compound, 0.05 to 20% by weight of a reducing agent, 0.05 to 20% by weight of a pH adjusting agent.

18. The flux for solder paste according to claim 16 or 17, wherein the pH adjusting agent comprises at least one of amine selected from the group consisting of alkanolamines, aliphatic primary, secondary or tertiary amines, aliphatic unsaturated amines, alicyclic amines, and aromatic amines.

19. A solder paste mainly comprising a flux according to claim 1 and a solder powder.

20. The solder paste according to claim 19, wherein the water content of the solder paste is 0.5% by weight or less.

21. The solder paste according to claim 19, which comprises a pH adjusting agent, wherein a solution prepared by dissolving 4 g of the flux comprising a pH adjusting agent in a mixture of 50 ml of toluene, 49.5 ml of ispropyl alcohol, and 0.5 ml of water, has a pH value of from 4 to 9 when measured with a pH meter.

22. The solder paste according to claim 21, whereinm the pH adjusting agent comprises at least one amine selected from the group consisting of alkanolamines, aliphatic primary, secondary of tertiary amines, aliphatic unsaturated amines, alicyclic amines and aromatic amines.

23. The solder pasted according to claim 19, wherein the solder powder comprises solder particles having a distribution such that the number of particles having a particle diameter of 20 82 m or less is 30% or less.

24. The solder paste according to claim 23, comprising, based on the total amount of the solder paste, 86 to 92% by weight of the solder powder and 8 to 14% by weight of the flux for solder paste which comprises an organic acid component consisting of an organic acid ester and an ester decomposer catalyst, an organic halogen compound, a reducing agent and a resin component.

25. The solder paste according to claim 24, wherein the water content of the solder paste is 0.5% by weight or less.

26. A soldering method for a circuit board comprising the steps of: applying the solder paste according to claim 19 to a circuit board and causing the solder paste applied on the circuit board to reflow.

27. The soldering method for a circuit board according to claim 26, comprising the step of placing electronic parts on the circuit board, wherein a part or all of the solder paste which has been caused to reflow is used to join the circuit board and the electronic parts together.

28. A circuit board produced by the soldering method for a circuit board according to claim 26.

29. A joint product produced by the soldering method for the circuit board according to claim 27.

30. A method for joining metals comprising the steps of: applying a solder paste according to claim 19 and which contains Sn and Zn to each joining portion of one or more metals selected form the group of aluminum, aluminum alloy, copper, and copper alloy; and reflowing the applied solder paste.

31. A method for joining metals according to claim 30, wherein one of the metals to be joined is aluminum or aluminum alloy, and another metal is copper or copper alloy.

32. A solder paste mainly comprising a flux and a solder powder, wherein the solder powder comprises solder particles having a distribution such that the number of particles having a particle diameter of 20 $\mu$m or less is 30% or less and, based on the total amount of the solder paste, the solder paste comprises 86 to 92% by weight of the solder powder and 8 to 14% by weight of the flux, wherein the flux comprises an organic acid component consisting of an organic acid ester and an ester decomposer catalyst, an organic halogen compound, a reducing agent and a resin component.

* * * * *